United States Patent
Bok

(10) Patent No.: US 8,003,540 B2
(45) Date of Patent: Aug. 23, 2011

(54) METHOD FOR MANUFACTURING SEMICONDUCTOR DEVICE

(75) Inventor: Cheol Kyu Bok, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 558 days.

(21) Appl. No.: 11/771,651

(22) Filed: Jun. 29, 2007

(65) Prior Publication Data

US 2008/0160770 A1    Jul. 3, 2008

(30) Foreign Application Priority Data

Dec. 28, 2006   (KR) .................. 10-2006-0136612

(51) Int. Cl.
  *H01L 21/311* (2006.01)
(52) U.S. Cl. ........ 438/703; 438/717; 438/725; 438/736; 257/E21.249
(58) Field of Classification Search .............. 438/717, 438/718, 725, 738, 703; 257/E21.249
See application file for complete search history.

(56) References Cited

U.S. PATENT DOCUMENTS

| | | | |
|---|---|---|---|
| 6,284,657 B1 * | 9/2001 | Chooi et al. | 438/687 |
| 6,569,605 B1 * | 5/2003 | Bae | 430/316 |
| 2002/0022195 A1 * | 2/2002 | Nakano et al. | 430/311 |
| 2004/0072098 A1 * | 4/2004 | Kozawa et al. | 430/270.1 |
| 2006/0127816 A1 * | 6/2006 | Kang et al. | 430/312 |
| 2006/0228895 A1 * | 10/2006 | Chae et al. | 438/725 |
| 2007/0020565 A1 * | 1/2007 | Koh et al. | 430/313 |
| 2007/0243714 A1 * | 10/2007 | Shin et al. | 438/706 |

FOREIGN PATENT DOCUMENTS

| | | |
|---|---|---|
| KR | 10-2003/0049198 A | 6/2003 |
| KR | 10-2006/0064861 A | 6/2006 |
| KR | 10-2006/0084501 A | 7/2006 |
| KR | 1020060084051 A | 7/2006 |
| KR | 10-2006/0125210 A | 12/2006 |
| KR | 10-2006/0133166 A | 12/2006 |

OTHER PUBLICATIONS

Toshiyuki Toyoshima, "0.1 u.m Level contact hole pattern formation with KrF lithography by Resist Enhancement Lithography Assisted by Chemical Shrink", IEEE, 1998.*

Laura J. Peters, "Resist Join the Sub-λ Revolution", Semiconductor International, Sep. 1999.

* cited by examiner

*Primary Examiner* — Angel Roman
(74) *Attorney, Agent, or Firm* — Kilpatrick Townsend & Stockton LLP

(57) ABSTRACT

A method for manufacturing a semiconductor device includes forming an underlying layer over a semiconductor substrate; forming a hard mask layer over the underlying layer; forming first etch patterns over the hard mask layer; forming second etch patterns between the first photoresist patterns; etching the hard mask layer using the first and second etch patterns as an etch mask to form a hard mask pattern; and etching the underlying layer using at least the hard mask pattern. The first and second etch patterns are formed on the same layer.

13 Claims, 8 Drawing Sheets

METHOD FOR MANUFACTURING SEMICONDUCTOR DEVICE

CROSS-REFERENCES TO RELATED APPLICATIONS

The present application claims priority to Korean patent application number 10-2006-0136612, filed on Dec. 28, 2006, which is incorporated by reference in its entirety.

BACKGROUND OF THE INVENTION

The present invention relates to a semiconductor device, and more particularly, to a method for manufacturing a semiconductor device in which two or more different photoresist patterns are used for a given mask pattern.

Due to high integration of semiconductor devices, the size of semiconductor devices has become smaller. As a result, the process margin for forming fine patterns is reduced.

When a contact hole or a line/space pattern is formed, it is difficult to form a pattern by a one-mask process with an exposer resolution smaller than a critical dimension. As a result, a double patterning process is used with two masks. The double patterning process is performed to create fine patterns. The pattern is divided into two groups with each group disposed at double the pitch, thereby overcoming limits of the exposer.

BRIEF SUMMARY OF THE INVENTION

Various embodiments of the present invention relate to a method for manufacturing a semiconductor device which includes forming first photoresist patterns without forming a polysilicon layer which is a second hard mask, hardening the first photoresist patterns, and forming second photoresist patterns between the first photoresist patterns to obtain a mask pattern which has a constant height for etching an underlying layer, thereby improving yield and reliability of semiconductor devices.

According to an embodiment of the present invention, a method for manufacturing a semiconductor device comprises: forming an underlying layer over a semiconductor substrate; forming a hard mask layer over the underlying layer; forming first photoresist patterns over the hard mask layer; hardening the first photoresist patterns; forming second photoresist patterns between the first photoresist patterns; etching the hard mask layer with the first and second photoresist patterns as masks to form a hard mask pattern; etching the underlying layer with the first and second photoresist patterns and the hard mask pattern; and removing the first and second photoresist patterns, and the hard mask pattern. The first and second photoresist patterns are defined on substantially the same plane.

In another embodiment, a method for manufacturing a semiconductor device includes forming an underlying layer over a semiconductor substrate; forming a hard mask layer over the underlying layer; forming first etch patterns over the hard mask layer; forming second etch patterns between the first photoresist patterns; etching the hard mask layer using the first and second etch patterns as an etch mask to form a hard mask pattern; and etching the underlying layer using at least the hard mask pattern. The first and second etch patterns are formed on the same layer.

In another embodiment, the method further comprises hardening at least an outer part of the first photoresist patterns prior to forming the second etch pattern. The first and second etch patterns are made of photoresist material.

In yet another embodiment, the method further comprises forming an bottom anti-reflective coating film over the hard mask layer, wherein the first and second etch patterns are formed directly on the bottom anti-reflective coating film, and wherein each first pattern is provided between the two adjacent second patterns.

DETAILED DESCRIPTION OF THE EMBODIMENTS

Figure 1A:
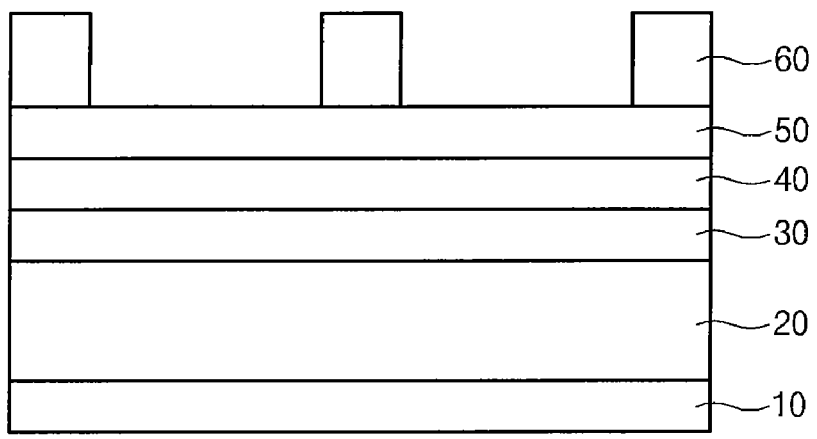
FIGS. 1a through 1g are cross-sectional diagrams illustrating a conventional double patterning process.
Figure 1B:
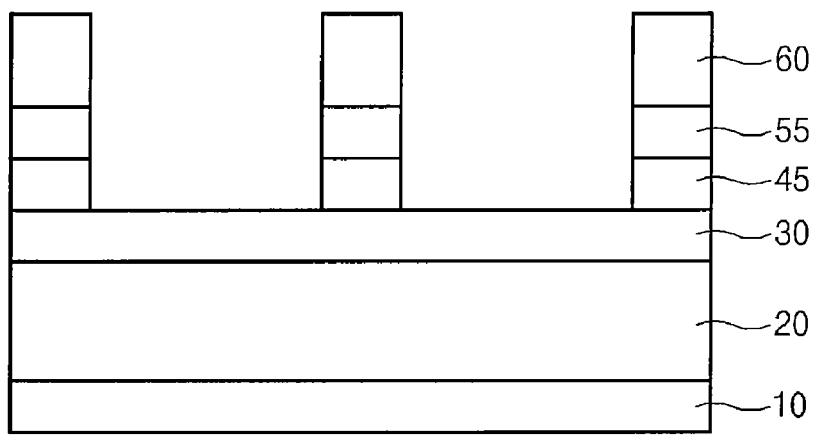
Figure 1C:
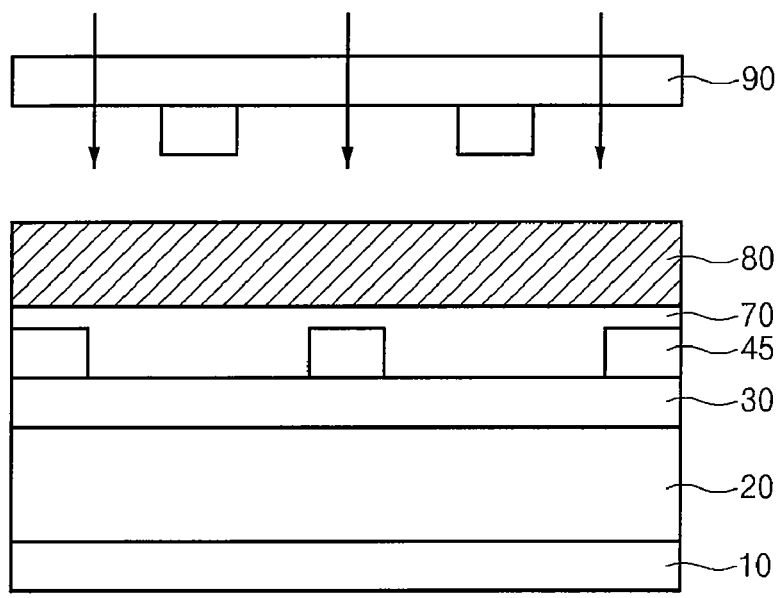
Figure 1D:
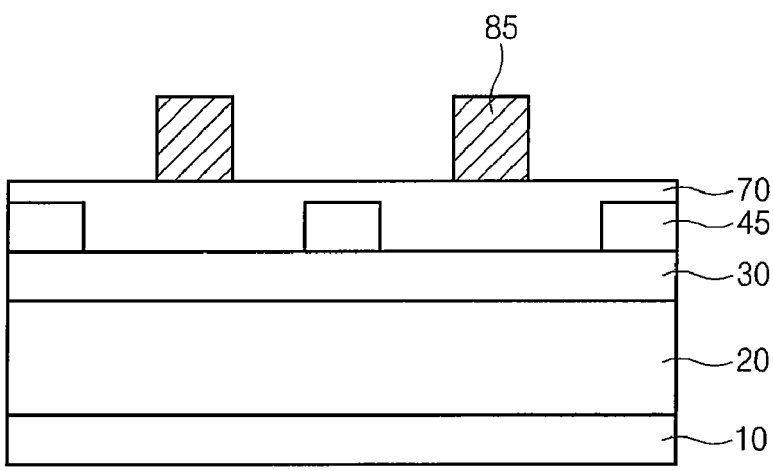
Figure 1E:
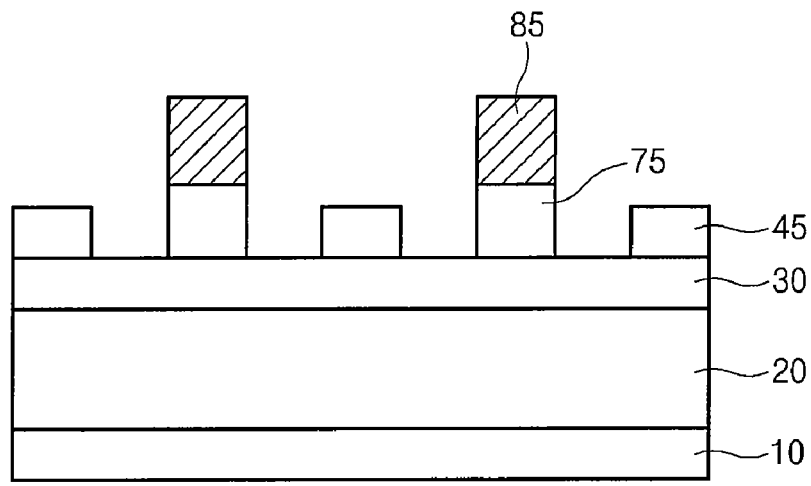
Figure 1F:
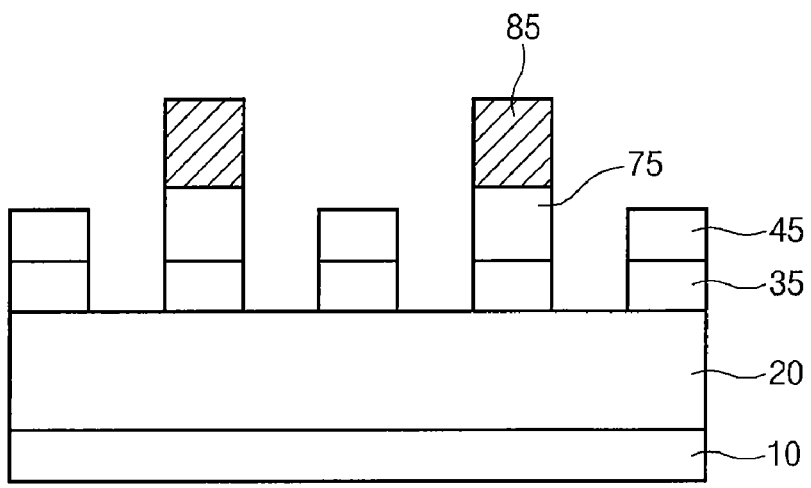
Figure 1G:
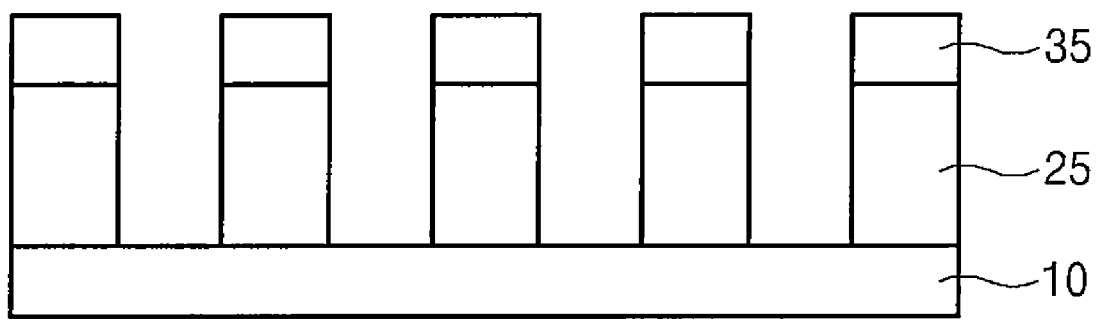

The present invention will be described in detail with reference to the accompanying drawings.

FIGS. 1a through 1g are cross-sectional diagrams illustrating a conventional double patterning process.

An underlying layer 20 is formed over a semiconductor substrate 10. A silicon oxynitride film 30, a first bottom anti-reflective coating film 40, and a polysilicon layer 50 are sequentially formed over the underlying layer 20. The silicon oxynitride film 30 is a first hard mask layer for a double patterning process, and the polysilicon layer 50 is a second hard mask layer.

A first photoresist pattern 60 is formed over the polysilicon layer 50.

The polysilicon layer 50 and the first bottom anti-reflective coating film 40 are etched with the first photoresist pattern 60 as a mask to form a polysilicon pattern 55 and a first anti-reflective pattern 45.

The first photoresist pattern 60 and the polysilicon pattern 55 are removed. A second anti-reflective coating film 70 is formed over the semiconductor substrate.

A second photoresist film 80 is formed over the second anti-reflective coating film 70. An exposure process is performed on a region between the first anti-reflective patterns 45 with a mask 90 that defines another pattern.

A developing process is performed to form a second photoresist pattern 85.

The second anti-reflective coating film 70 is etched with the second photoresist pattern 85 as a mask.

The silicon oxynitride film 30 is etched with the second photoresist pattern 85, the second anti-reflective pattern 75 and the first anti-reflective pattern 45 as masks to form a silicon oxynitride pattern 35.

Through the above-described steps, a mask pattern that defines a fine pattern is obtained. The mask pattern comprises a first mask pattern including the first anti-reflective pattern 45 and the silicon oxynitride pattern 35, and a second mask pattern including the second photoresist pattern 85, the second anti-reflective pattern 75 and the silicon oxynitride pattern 35.

The underlying layer 20 is etched with the mask pattern. Since a height difference exists between the first mask pattern and the second mask pattern, which affects the etching process, the critical dimensions of the fine pattern 25 can vary.

Also, the double patterning process for forming a fine pattern requires steps for forming a photoresist pattern twice, forming a hard mask twice, and forming an anti-reflective coating film twice. As a result, the process is complicated and increases production cost.

When the mask pattern for forming a fine pattern is defined, the height of the first mask pattern is different from that of the second mask pattern. As a result, a stable critical dimension cannot be secured when the underlying layer is etched.

FIGS. 2a through 2g are cross-sectional diagrams illustrating a method for manufacturing a semiconductor device according to an embodiment of the present invention.

An underlying layer 110 is formed over a semiconductor substrate 100. The underlying layer 110 is formed to have a thickness ranging from about 1000 to 3000 Å with an amorphous carbon layer. The amorphous carbon layer is formed by a Plasma Enhanced Chemical Vapor Deposition (PECVD) method.

Instead of the amorphous carbon layer, a Spin-On Carbon (SOC) material can be used by a spin coating method.

A hard mask layer 120 is formed over the underlying layer 110. The hard mask layer 120 is formed to have a thickness ranging from about 300 to 500 Å with a silicon oxynitride film.

A bottom anti-reflective coating film 130 is formed over the hard mask layer 120. The bottom anti-reflective coating film 130 is formed to have a thickness ranging from about 200 to 400 Å.

A first photoresist pattern 140 is formed over the bottom anti-reflective coating film 130. The first photoresist pattern 140 as a positive photoresist film is formed to have a thickness ranging from about 1400 to 1600 Å. The first photoresist pattern 140 is formed by an exposure and developing process using a first mask which defines patterns corresponding to double the pitch of the target pitch. The exposure process is performed with a light source selected from the group consisting of I-kine, KrF, ArF and EUV. The developing process is performed with a 2.38 wt % Tetra Methyl Ammonium Hydroxide (TMAH) aqueous solution. In this embodiment, a line/space pattern is formed by an ArF immersion scanner.

The first photoresist pattern 140 is hardened. The hardening step is performed on the semiconductor substrate 100 including the photoresist pattern by an exposure process using an UV or Electron Beam or a Resolution Enhancement Lithography Assisted by Chemical Shrink (RELACS) material.

The UV method is performed with a light ranging from about 10 to 1000 nm and with an energy ranging from about 10 to 1000 mJ/cm$^2$. The Electron Beam method is performed with an energy ranging from about 10 to 1000 mJ/cm$^2$.

The RELACS method is performed using a cross-linking reaction with the photoresist film.

Figure 2A:
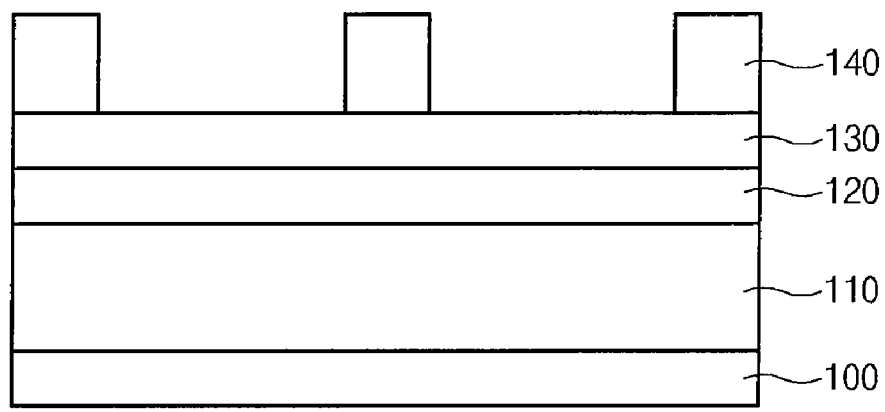
FIGS. 2a through 2g are cross-sectional diagrams illustrating a method for manufacturing a semiconductor device according to an embodiment of the present invention.
Figure 2B:
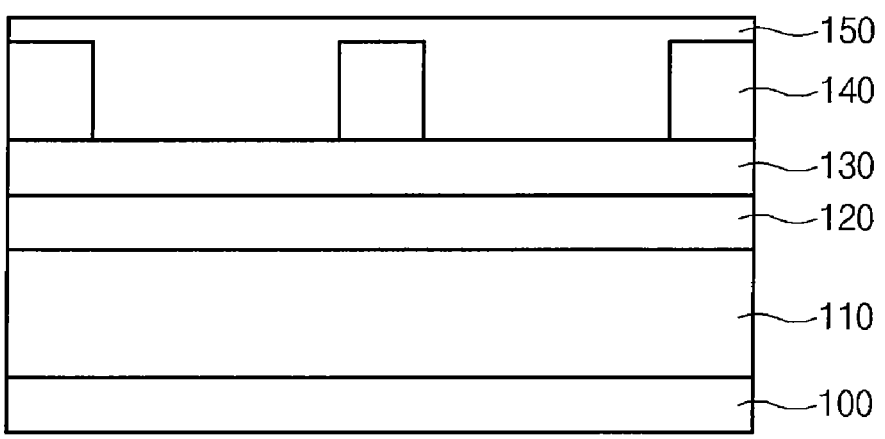
Figure 2C:
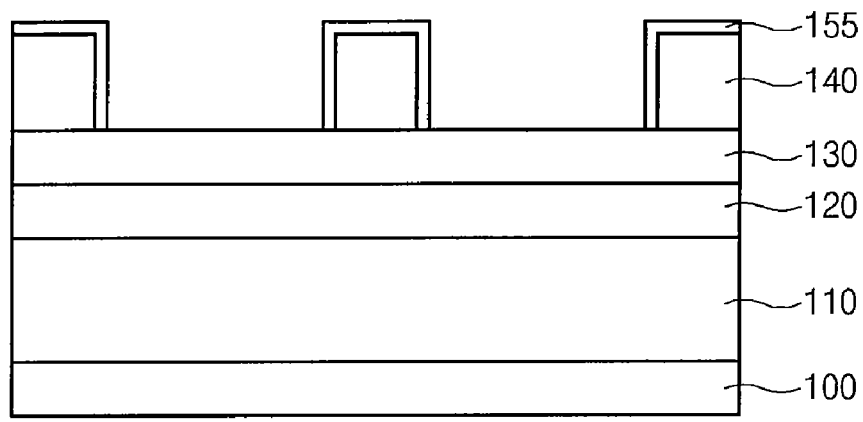
Figure 2D:
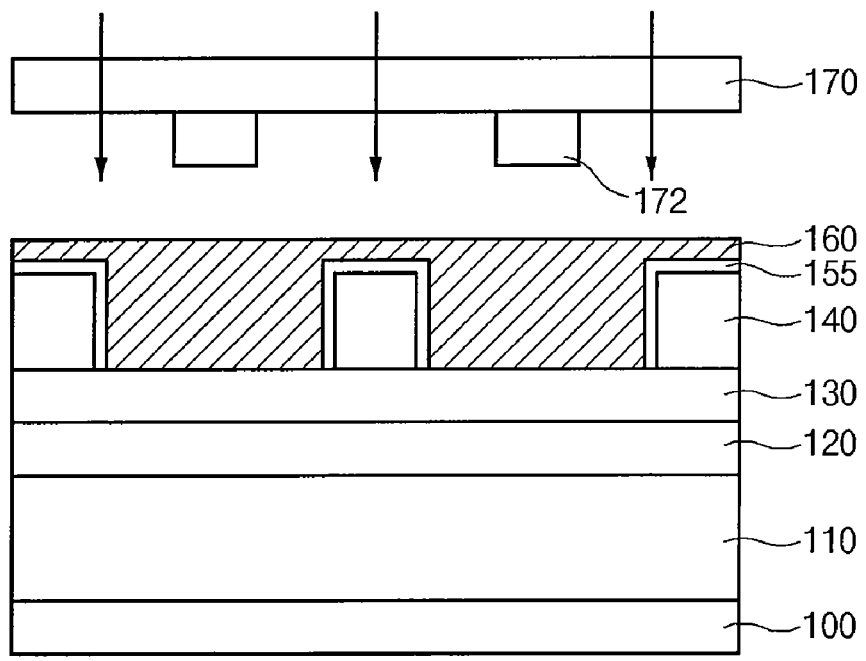
Figure 2E:
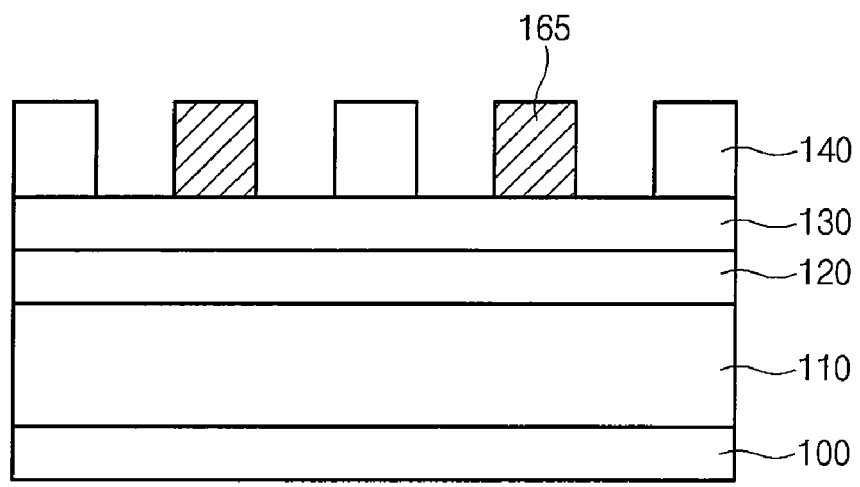
Figure 2F:
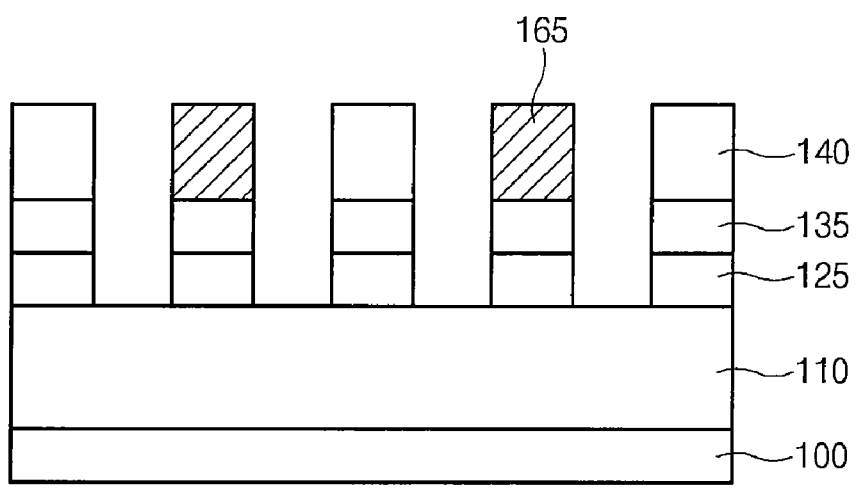
Figure 2G:
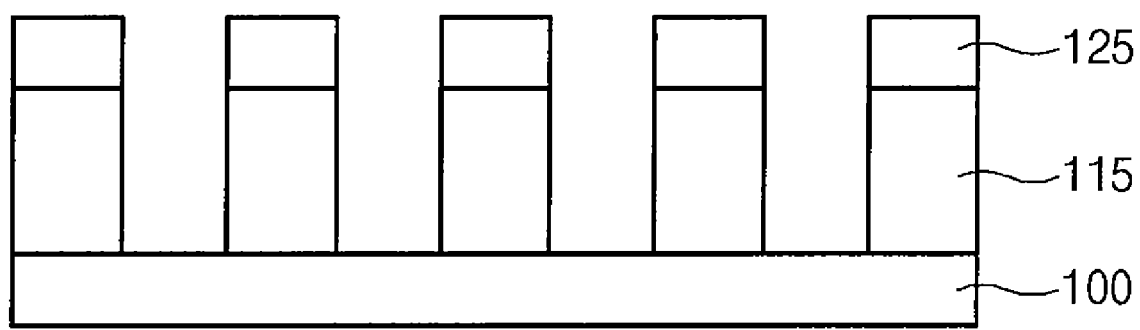

FIG. 2b shows a RELACS material 150 formed over the bottom anti-reflective coating film 130 including the first photoresist pattern 140. The RELACS material 150 is formed to have a thickness ranging from about 1500 to 2500 Å.

A baking process is performed on the semiconductor substrate 100 over a hot plate at a temperature ranging from about 120 to 160° C. for 80~100 seconds. In the baking process, the RELACS material 150 disposed in an interface between the first photoresist pattern 140 and the RELACS material 150 is hardened by the cross-linking reaction.

The RELACS material 150 is removed by Deionized Water (DIW). A hardened layer 155, which is hardened by the baking process, remains over the first photoresist pattern 140 to have a thickness ranging from about 10 to 100 Å. The hardening process is called a bleaching process.

A second photoresist film 160 is formed over the semiconductor substrate 100. An exposure process is performed on a region between the first photoresist patterns 140 with a mask 170 that defines a pattern 172 having substantially the same dimension as that of the first photoresist pattern 140. Each pattern 172 is positioned between two adjacent first photoresist patterns 140, to block the exposure of the corresponding region below in the second photoresist film 160. The second photoresist film 160 as a positive film is formed to have a thickness ranging from about 1400 to 1600 Å. The exposure process is performed with a light source selected from the group consisting of I-kine, KrF, ArF and EUV by an ArF immersion scanner.

A developing process is performed on the second photoresist film 160 to form a second photoresist pattern 165 between the first photoresist patterns 140. The developing process is performed with a 2.38 wt % TMAH aqueous solution.

The hardened layer 155 prevents the first photoresist pattern 140 from being damaged from the exposure and developing process for forming the photoresist pattern 165. Also, the hardened layer 155 is removed in the developing process for forming the second photoresist pattern 165, so that a photoresist mask pattern can be formed for forming a fine pattern having a line/space shape without any additional process.

The bottom anti-reflective coating film 130 and the hard mask layer 120 are etched with the first and second photoresist patterns 140 and 165 as masks to form a bottom anti-reflective pattern 135 and a hard mask pattern 125. The etching process is performed under a pressure ranging from about 90 to 110 mT, a power source ranging from about 200 to 400 W, and a plasma atmosphere selected from the group consisting of $CF_4$ ranging from about 40 to 60 sccm, $CHF_3$ ranging from about 40 to 60 sccm, $O_2$ ranging from about 5 to 9 sccm, and combinations thereof.

The underlying layer 110 is etched with the first and second photoresist patterns 140 and 165, and the bottom anti-reflective pattern 135 and the hard mask pattern 125 as masks to form a fine pattern 115. The etching process is performed under a pressure ranging from about 150 to 170 mT, a power source ranging from about 100 to 200 W, and a plasma atmosphere selected from the group consisting of $CF_4$ ranging from about 60 to 100 sccm, $CHF_3$ ranging from about 10 to 40 sccm, $O_2$ ranging from about 9 to 15 sccm, and combinations thereof.

The first and second photoresist patterns 140 and 165 are removed by a strip process using an $O_2$ gas. Also, the bottom anti-reflective pattern 135 is removed.

In this embodiment, a double patterning process is performed to form a fine pattern, using a hard mask layer and a bottom anti-reflective film.

In other words, the process for forming a second hard mask on a different layer is not performed. Instead, the first photoresist pattern is formed and hardened so that the second photoresist pattern is formed in the same layer including the first photoresist pattern. When the first and second photoresist patterns are formed in the same layer, the height of the mask pattern for etching the underlying layer is maintained so that a stable critical dimension of the fine pattern can be obtained.

As a result, the process is simplified because the processes for forming and etching the second hard mask layer and the second anti-reflective coating film are not performed.

As described above, in a method for manufacturing a semiconductor device according to an embodiment of the present invention, a first photoresist pattern is formed and hardened, and a second photoresist pattern is formed between the first photoresist patterns. As a result, a mask pattern having a relatively low height can be used to etch an underlying layer.

If the height of the mask pattern is kept low, a stable critical dimension of a fine pattern can be obtained in a process for etching the underlying layer to improve a process margin of the semiconductor device.

A step for forming and etching a second hard mask in a double hard mask is not performed, thereby simplifying the process to improve yield and reliability of the semiconductor device.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    forming an underlying layer over a semiconductor substrate;
    forming a hard mask layer over the underlying layer;
    forming first photoresist patterns over the hard mask layer;
    forming a hardening layer on the first photoresist patterns, wherein the hardening layer is formed on the first photoresist patterns by an exposure process using an ultraviolet beam or an electron beam;
    forming second photoresist patterns between the first photoresist patterns, the first and second photoresist patterns being defined on substantially the same plane, wherein the first and second photoresist patterns are formed using the same mask;
    etching the hard mask layer with the first and second photoresist patterns as masks to form a hard mask pattern;
    etching the underlying layer with the first and second photoresist patterns and the hard mask pattern; and
    removing the first and second photoresist patterns, and the hard mask pattern.

2. The method according to claim 1, wherein the underlying layer includes an amorphous carbon layer.

3. The method according to claim 2, wherein the amorphous carbon layer has a thickness ranging from about 1000 to 3000Å.

4. The method according to claim 1, wherein the hard mask layer includes a silicon oxynitride film.

5. The method according to claim 4, wherein the silicon oxynitride film has a thickness ranging from about 300 to 500Å, wherein the first and second photoresist patterns are formed directly on a bottom anti-reflective coating film that is formed over the hard mask layer.

6. The method according to claim 4, wherein the forming-a-hard-mask-layer further includes forming a bottom anti-reflective coating film over the silicon oxynitride film.

7. The method according to claim 6, wherein the bottom anti-reflective coating film has a thickness ranging from about 200 to 400Å.

8. The method according to claim 1, wherein the first photoresist pattern includes a positive photoresist film.

9. The method according to claim 1, wherein the first photoresist pattern has a thickness ranging from about 1400 to 1600Å.

10. The method according to claim 1, wherein the second photoresist pattern is formed of a positive photoresist.

11. The method according to claim 1, wherein the second photoresist pattern has a thickness ranging from about 1400 to 1600Å.

12. A method for manufacturing a semiconductor device, the method comprising:
    forming an underlying layer over a semiconductor substrate;
    forming a hard mask layer over the underlying layer;
    forming first etch patterns over the hard mask layer, wherein the first etch patterns comprise photoresist material;
    forming a hardening layer over the first etch patterns, wherein the hardening layer is formed on the first etch patterns by an exposure process using an ultraviolet beam or an electron beam;
    forming second etch patterns between the first etch patterns, wherein the second etch patterns are formed after the hardening layer is formed, the second etch patterns comprising photoresist material, wherein the first and second etch patterns are formed by using the same mask;
    etching the hard mask layer using the first and second etch patterns as an etch mask to form a hard mask pattern; and
    etching the underlying layer using at least the hard mask pattern,
    wherein the first and second etch patterns are formed substantially on the same layer.

13. The method of claim 12, further comprising:
    forming an bottom anti-reflective coating film over the hard mask layer,
    wherein the first and second etch patterns are formed directly on the bottom anti-reflective coating film, and
    wherein each first pattern is provided between the two adjacent second patterns.

* * * * *